US009148055B2

(12) United States Patent
Sama Rubio et al.

(10) Patent No.: US 9,148,055 B2
(45) Date of Patent: Sep. 29, 2015

(54) POWER SYSTEM WITH ELECTRONIC IMPEDANCE SWITCH CONTROLS AND METHODS FOR SUPPLYING POWER TO A LOAD

(71) Applicant: Cooper Technologies Company, Houston, TX (US)

(72) Inventors: Daniel Sama Rubio, Lake Oswego, OR (US); Marlowe J. Buchanan, Lake Oswego, OR (US)

(73) Assignee: COOPER TECHNOLOGIES COMPANY, Houston, TX (US)

( * ) Notice: Subject to any disclaimer, the term of this patent is extended or adjusted under 35 U.S.C. 154(b) by 405 days.

(21) Appl. No.: 13/836,893

(22) Filed: Mar. 15, 2013

(65) Prior Publication Data

US 2014/0265556 A1    Sep. 18, 2014

(51) Int. Cl.
| | |
|---|---|
| *H02M 3/156* | (2006.01) |
| *B60L 1/00* | (2006.01) |
| *H03K 17/30* | (2006.01) |
| *H02M 1/36* | (2007.01) |
| *H02M 3/158* | (2006.01) |
| *H01H 9/54* | (2006.01) |
| *H02M 1/00* | (2007.01) |

(52) U.S. Cl.
CPC .............. *H02M 3/156* (2013.01); *B60L 1/00* (2013.01); *H02M 1/36* (2013.01); *H02M 3/158* (2013.01); *H03K 17/302* (2013.01); *H02M 2001/0045* (2013.01); *Y10T 307/858* (2015.04)

(58) Field of Classification Search
USPC ........................................................ 307/140
See application file for complete search history.

(56) References Cited

U.S. PATENT DOCUMENTS

| | | | |
|---|---|---|---|
| 5,581,433 | A | 12/1996 | Jordan |
| 5,943,203 | A | 8/1999 | Wang |
| 6,958,515 | B2 | 10/2005 | Hower et al. |
| 7,508,641 | B2 | 3/2009 | Ball et al. |
| 7,538,528 | B2 | 5/2009 | Heath |
| 2008/0310198 | A1 | 12/2008 | Chiang et al. |
| 2009/0072803 | A1 | 3/2009 | Tiew et al. |
| 2009/0115279 | A1 | 5/2009 | Spaggiari |
| 2009/0146633 | A1 | 6/2009 | Karasawa et al. |
| 2010/0123978 | A1 | 5/2010 | Lin et al. |

OTHER PUBLICATIONS

International Search Report and Written Opinion of International Application No. PCT/US2014/021012; Jul. 23, 2014; 9 pages.

*Primary Examiner* — Robert Deberadinis
(74) *Attorney, Agent, or Firm* — Armstrong Teasdale LLP

(57) ABSTRACT

Power systems, electronic impedance controlled switches and controls, and methods of supplying power to a load include features to maximize safe operating area (SOA) of an electronic impedance switch without exceeding its SOA. The power system may be a vehicle electrical power system including a DC power supply battery and a boost converter.

31 Claims, 6 Drawing Sheets

POWER SYSTEM WITH ELECTRONIC IMPEDANCE SWITCH CONTROLS AND METHODS FOR SUPPLYING POWER TO A LOAD

BACKGROUND OF THE INVENTION

The field of the invention relates generally to electrical power systems including electronically controlled switches supplying power to a load, and more specifically to boost converter circuitry including a controlled impedance switch to connect a boosted voltage to a load.

Electrical power converter circuitry for DC circuits are generally known and in widespread use. Certain circuits are sometimes referred to as boost or buck converters and are used in a variety of applications, including but not limited to electrical power systems for vehicles. The boost converters typically receive input power at a first voltage $V_{in}$ from a power supply such as a vehicle battery in one example, and output electrical power to a load at a second voltage $V_{out}$ higher than the first voltage. Thus, by virtue of the boosted voltage, electrical loads may be driven from a power supply which would otherwise be insufficiently served by the power supply alone operating at the first voltage. In a vehicle environment, such loads may include, but are not necessarily limited to communications electronics, compressors, an anti-lock brake system (ABS) unit, and lighting systems.

In some known boost converter systems, a Metal-Oxide-Semiconductor Field Effect Transistor (MOSFET) is provided and utilized as a controlled impedance switch between the boost converter and the load, so that the converted output voltage to a downstream load rises slowly, thus minimizing surge currents and the disruptions that abrupt voltage changes may otherwise cause. The more intelligent of these systems actively monitor current flow through the MOSFET, which allows the circuit to act as an Electronic Circuit Breaker (ECB), a Load Switch, and a Load Inrush Controller. The most intelligent of these systems recognize that for higher currents and voltages, the power dissipated in the MOSFET while in its linear region as it ramps up/down the output voltage could exceed the rated Safe Operating Area (SOA) of the MOSFET. To address such concerns, known systems have implemented active current and power limiting schemes, and Fault Timers to prevent the MOSFET from exceeding its SOA and potentially failing. While such techniques can be effective in some applications, they remain problematic for others, and improvements are desired.

BRIEF DESCRIPTION OF THE DRAWINGS

Non-limiting and non-exhaustive embodiments are described with reference to the following Figures, wherein like reference numerals refer to like parts throughout the various drawings unless otherwise specified.

DETAILED DESCRIPTION OF THE INVENTION

Figure 1:
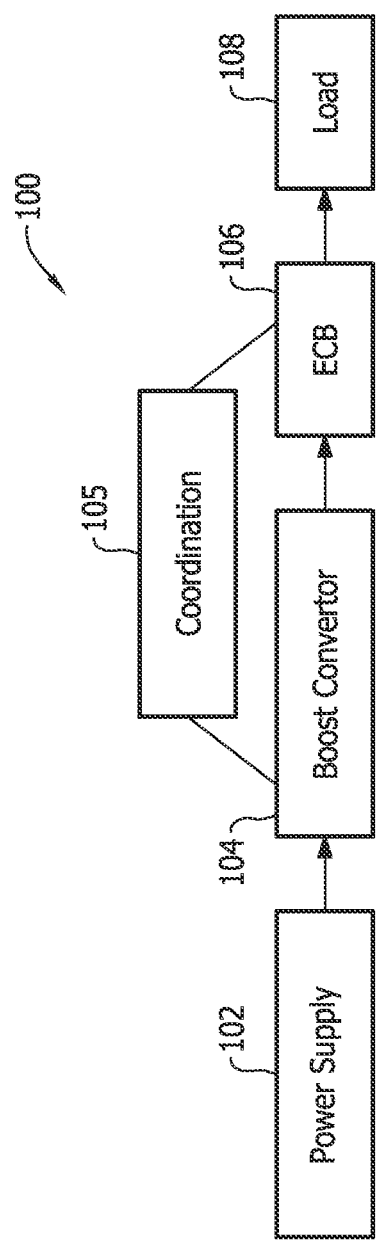
FIG. 1 is a block diagram of an exemplary boost converter system according to an exemplary embodiment of the present invention.

FIG. 1 is a block diagram of an exemplary electrical power system in the form of a boost converter system 100 including a power supply 102, a boost converter 104, an electronic circuit breaker (ECB) 106 and a load 108. The power supply 102 may be, as one example, a 12V DC battery providing input electrical power to the boost converter 104. The boost converter 104 may, for example, convert a lower input voltage of a power supply 102 (such as about 12VDC power in one exemplary embodiment) to a higher output voltage (such as about 24V in one exemplary embodiment). The output voltage of the boost converter 104, referred to as the boosted voltage, is then supplied to the load 108 through the ECB 106. Various types of boost converters are known and may be used as the boost converter 104. As boost converter topologies are generally known and understood, further explanation thereof is considered unnecessary.

The higher/boosted voltage output of the boost converter 104 is input to the ECB 106, which in turn effectively switches ON the load 108 by providing a regulated voltage and/or current flow thereto. The regulated current flow safely transitions the load 108 from a fully OFF state where no voltage or current is supplied thereto, to a fully ON state where the output voltage from the boost converter 104 is supplied to the load 108 and current is drawn. The ECB 106 provides combined circuit breaker, load switch, and load inrush controller functionality, and may include one or more MOSFET elements as further explained below.

The arrangement shown in FIG. 1 is suitable for use in a vehicle power system to boost a lower DC voltage from a battery power supply to the higher/boosted voltage to drive various loads. It is recognized, however, that the control elements and methods described herein also apply to non-vehicular applications and other electrical power systems. Thus, while the concepts discussed below are described in the context of an electrical power system for a vehicle, the vehicle application is presented for the sake of illustration rather than limitation. Moreover, while exemplary voltages, amperages, resistances, capacitance and other circuit parameters are discussed herein, they are exemplary only and it is understood that other values for such parameters, both greater and lower than the values specifically discussed herein, may be utilized with similar effect. Moreover, it is recognized that in other applications and embodiments, the power supply 102 need not necessarily be a DC power supply, but rather may be an alternating current (AC) power supply that is converted to DC power for driving various loads.

Problems arise when a power converter circuit utilized in the boost converter 104 is required to bring up the load 108 at sufficiently high current and voltage and over a sufficiently long period that the calculated stress on one or more of the MOSFETs utilized in the ECB 106 exceeds its specified SOA. This is especially a problem for situations where, as shown in FIG. 1, the load 108 and the ECB 106 utilizing one or MOSFETs follow a boost converter 104, such as in a common motive application where a 12V system battery feeds the boost converter 104 to power very heavy 24V loads. As used herein, "heavy" loads shall refer to loads measured in Amps to many scores of Amps, and may include but are not limited to non-linear loads such as those with large amounts of capacitance, motor windings, tungsten lamps, and the like.

To accommodate heavy loads, more than one MOSFET may be connected in parallel in the ECB 106. Since MOSFETs in linear mode do not share equally, and in fact may hardly share at all, one cannot simply parallel several MOSFETs to increase the SOA of interconnected MOSFETs. While several MOSFETs will achieve lower switch loss when fully enhanced, the effective SOA when in linear mode is in worst case the same as a single one of the MOSFETs present in the ECB 106. There appear to be limits, however, in solid-state physics and chemistry that constrain the ability of MOSFET designers to make breakthrough improvements in SOA characteristics, and as a result, when considering SOA as a key characteristic, the best available MOSFET SOAs in 2012 are largely the same as those available in 1999. Thus, MOSFET SOA considerations are a practical constraint for modern high-power boost systems. Boost applications today that would overstress the highest SOA MOSFET presently available cannot, at least for the time being, be addressed by near-term improvements in MOSFET SOA technology.

Conventionally, "heavy" loads 108 have simply been connected quickly to the power source 102 via the boost converter 104, resulting in large inrush currents to the load circuitry. Circuits tolerant of such abrupt ON/OFF operation mode typically are not as protective of themselves, the power source, or their load as may be desired. While some boost converter systems employ load inrush controls, the implementation of such load inrush controls may themselves, unbeknownst to the system designers, be overtaxing the SOA of the MOSFETs utilized. Of course, exceeding the SOA limits of the MOSFETs may result in scattered failures of the circuits and possible damage to the associated loads. Even well designed systems that do not ordinarily suffer from overtaxed SOAs of the MOSFETs may be negatively impacted if and when real world conditions take an unexpected deviation from the boundaries for which the system was designed to endure.

So long as the load 108 and the power supply 102 and the system application in general are tolerant of fast ON/OFF transitions, the ramifications of Linear Mode operation are of little concern. However, if an application for whatever reason requires a relatively slow transition between OFF and ON states, MOSFET SOA becomes a key concern, and a control scheme to maximize its effective use becomes important.

Considering an exemplary boost converter system, such as the system 100, in which a MOSFET utilized in the ECB 106 will be tasked to turn ON/OFF a variety of user provided loads 108, including loads with significant capacitance, a number of observations are appropriately stated. Current flow I through the ECB 106 that is output to the load 108 generally follows the relationship below.

$$I = C * \Delta V / \Delta t + V/R \quad (1)$$

where V is the applied voltage to the load from the ECB 106, C is the capacitance and R is the resistance associated with the load. One can calculate the average surge current that is drawn by load 108 capacitance C if the ECB 106 (operating as a switch in this context) linearly ramps from zero voltage to another voltage (a voltage difference of $\Delta V$) over a given duration of time ($\Delta t$). For example, applying this relationship to a load that happens to be bypassed by just 100 μF and is pulled up to 12V in 20 μsec would pull a surge current of 60 A to charge the capacitor. As a comparative example, for a different load having a much larger bypass capacitance of 1 mF, if one were to slow the transition time to 100 μsec but pull the load up to 28V, the surge current grows to 280 A. Large electronic loads may indeed have many mF of bypass capacitance, creating massive surge currents if switched quickly.

Large surge currents can, in turn, damage components in the load circuit, trip overcurrent protection devices such a fuses, and affect other loads by causing a dip in the power source or power supply voltage. A potential solution to such issues relates to increasing the MOSFET transition time to the pulled up voltage (i.e., increasing $\Delta t$). For example, a MOSFET with an appropriate SOA can pull a 10 mF load up to 28V in 20 msec with just a 14 A surge.

For the more general case where the nature of the power source 102 and the load 108 is variable, the turn ON/OFF of the MOSFET die(s) included in the ECB 106 can be controlled and actively managed so as to keep the MOSFET(s) within their respective SOAs. For example, measurements of the current through the MOSFET(s) and the voltage across them may be input to an analog controller, a digital signal processor, or a microprocessor, which then controls the MOSFET gate voltage so as to keep the die within its SOA current and power ratings. As understood in the art, the SOA of a given MOSFET element defines maximum value of drain-to-source voltage, drain current, and their product which is power in the die. The SOA guarantees safe operation of the MOSFET element, and is typically provided by the manufacturer of the MOSFET element in terms of data plots or curves. By keeping a MOSFET power and drain current within a defined SOA curve with appropriate circuitry, a reliable electronic circuit breaker functionality effectively results. Indeed, analog integrated circuits (ICs) are commercially available that are designed to keep a MOSFET within its SOA when performing a "Hot Swap" function, which is another name for an electronic switch whose rise time is slowed to restrict surge currents. This is generally the same functionality required for an ECB.

A basic vehicle boost application includes a battery power supply 102, a boost converter 104 interfaced with the battery 102, and a load 108 connected to the boost 104 output. When it isn't operating or is overloaded, the boost converter 104 appears like a diode whose anode connects to the power source 102 (i.e., the battery in this example) and whose cathode connects to the load 108. That is, the load 108 is always connected to the power source 102 at a voltage of the power supply ($V_{in}$) minus a diode drop ($V_f$), or alternatively to the higher boosted voltage ($V_{out}$) if the boost converter 104 is operating. Without added protection, however, there is no way to disconnect the power supply 102 from the load 108, and a short placed across the output can draw huge currents that almost certainly will damage the converter 106 or wiring or power source 102. The output path of the boost converter 106 is thus an excellent spot to place an electronic switch with circuit breaker capabilities, such as the ECB 106, and if the intended load 108 includes significant capacitance or non-linear resistance as is generally the case with tungsten-based lamps, MOSFET(s) controlled to perform the "Hot Swap" function (i.e., slow transition time with circuitry keeping the die within its SOA) in the ECB 106 are well suited for this task. A practical and very useful example of the vehicle boost application of FIG. 1 is the case where a boost converter 104 is used to step a lower voltage from the power supply 102 up to a higher one, perhaps boosting a 9-16V output voltage from a 12V battery up to 28V.

As mentioned above, however, an unfortunate trait of MOSFETs in Linear Mode is that they may not share the load current very well, or even hardly at all. Thus two, four, or even more MOSFETs connected in parallel may effectively handle a heavy load's steady-state current draw, but during inrush current conditions and fault conditions the stress does not spread over the plurality of MOSFETs, and as a result inrush and fault currents may actually be borne fully by a single one of the MOSFETs. Where the load is large and the ramp time needed is so long that the SOA of the best MOSFET available isn't sufficient to keep the MOSFET in its SOA, a different approach is required because the best available MOSFETs today in terms of SOA will likely, and undesirably, be overtaxed in use.

High-power boost systems, controlled impedance switch circuits and methods are disclosed herein that better accommodate the present limitations of fixed SOA capability when MOSFETs are utilized as an Electronic Circuit Breaker (ECB)/Load Inrush Controller as generally shown in FIG. 1. Beneficially, proper coordination 105 between the boost converter 104 and the ECB 106, and of their respective ramp rates, can dramatically reduce the SOA stress on the MOSFET controlled impedance switch present in the ECB 106 while still giving a low-inrush and fully protected slow ramp-up of voltage to the load 108. As explained below, the coordination 105 between the ECB and the boost converter is implemented in exemplary embodiments wherein circuitry is provided to modify when each is enabled in respect to the other being enabled, and if desired the boost converter 104 can make one or more early steps to a lower voltage before having it boost up to the required final regulation point for driving the Load 108. Various approaches are possible to accomplish the coordination. Method aspects thereof will be in part explicitly discussed and in part apparent from the discussion below.

In an exemplary three step approach, this is effectively accomplished by causing the ECB 106 to first ramp the load 108 up to a lower initial output of the boost converter 104 prior to allowing the boost converter 104 to boost up to a regulated output voltage somewhat higher than that provided by Power Supply 102, and then continuing to keep the ECB 106 in near if not complete saturation while ramping the boost output up to the final required load voltage.

Alternatively, in an exemplary two step approach, the ECB 106 may be made to ramp the load 108 up towards the non-boosted output of boost converter 104 (i.e., towards a diode drop below the $V_{in}$ supplied to said converter), or to a preset lower boost regulation point, and then continue the enhancement of the ECB pass element as the boost converter begins to boost its $V_{in}$ up to the desired final $V_{out}$.

More specifically, by initiating enhancement of the MOSFETs in the ECB 106 when the output voltage $V_{out}$ of the boost converter 104 is lower or only slightly higher than the input voltage $V_{in}$, one can either increase allowed current or increase allowed time in Linear Mode as opposed to an embodiment where enhancement begins after $V_{out}$ has reached its boosted target.

For example, again considering a motive 12VDC system utilizing a boost converter to power 24-28VDC loads, a MOSFET that performs to a constant power SOA can for the same thermal stress pull a very much larger load from 0V to about 12V than it could from 0V to about 24V, and if one factors in that most real MOSFETs have some reduction of power capability at higher drain-to-source voltage $V_{ds}$, the advantage grows further. Therefore, a control scheme that enhances the MOSFET controlled impedance switch in the ECB 106 prior to initiating the boost converter 104 ramp to an intermediate output (three step approach), or during/after the boost converter 104 has been ramped to a low stable voltage (two step approach), and then allows the MOSFETs to stay at low $V_{ds}$ as the boost convertor output ramps up to its target, maximizes the use of that part's SOA. Certainly, one refinement is to match the general $\Delta V/\Delta t$ of the MOSFET controlled impedance switch utilized in the ECB 106 to the rise time of the boost converter 104, and then time the start of the boost converter 104 so that the load 108 sees a roughly continuous rise of its voltage. Whereas two and three step approaches have been highlighted in this discussion, the boost converter 104 could step to any arbitrary number of intermediate regulation points before reaching the desired final regulated output and this might be more obviously observed in a digital version of the control scheme.

Figure 2:
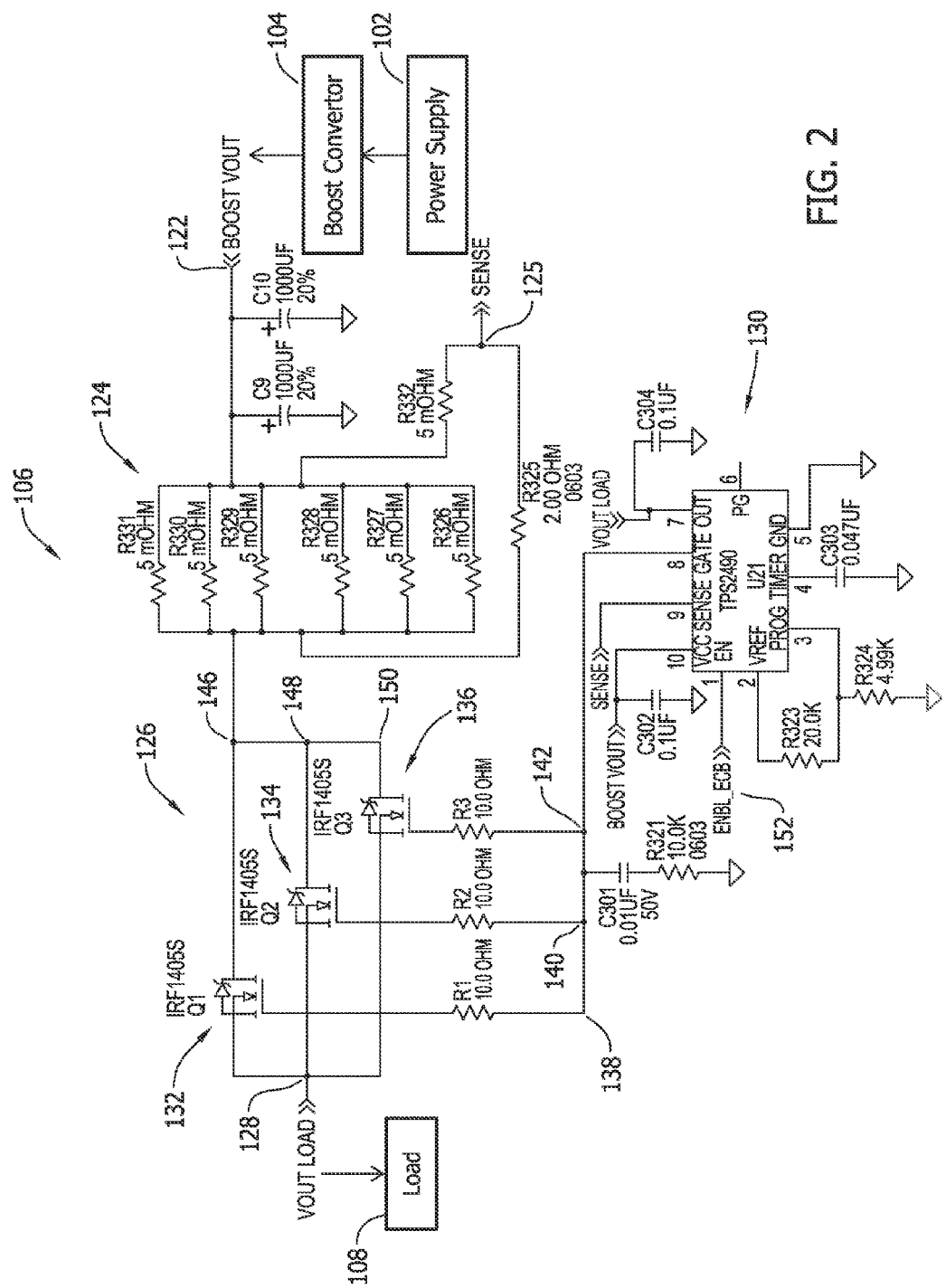
FIG. 2 shows an exemplary schematic of control circuitry to maintain MOSFETs within their SOA while implementing the functions of an ECB/Load Switch/Load Inrush Controller in the exemplary boost converter system shown in FIG. 1.
Figure 3:
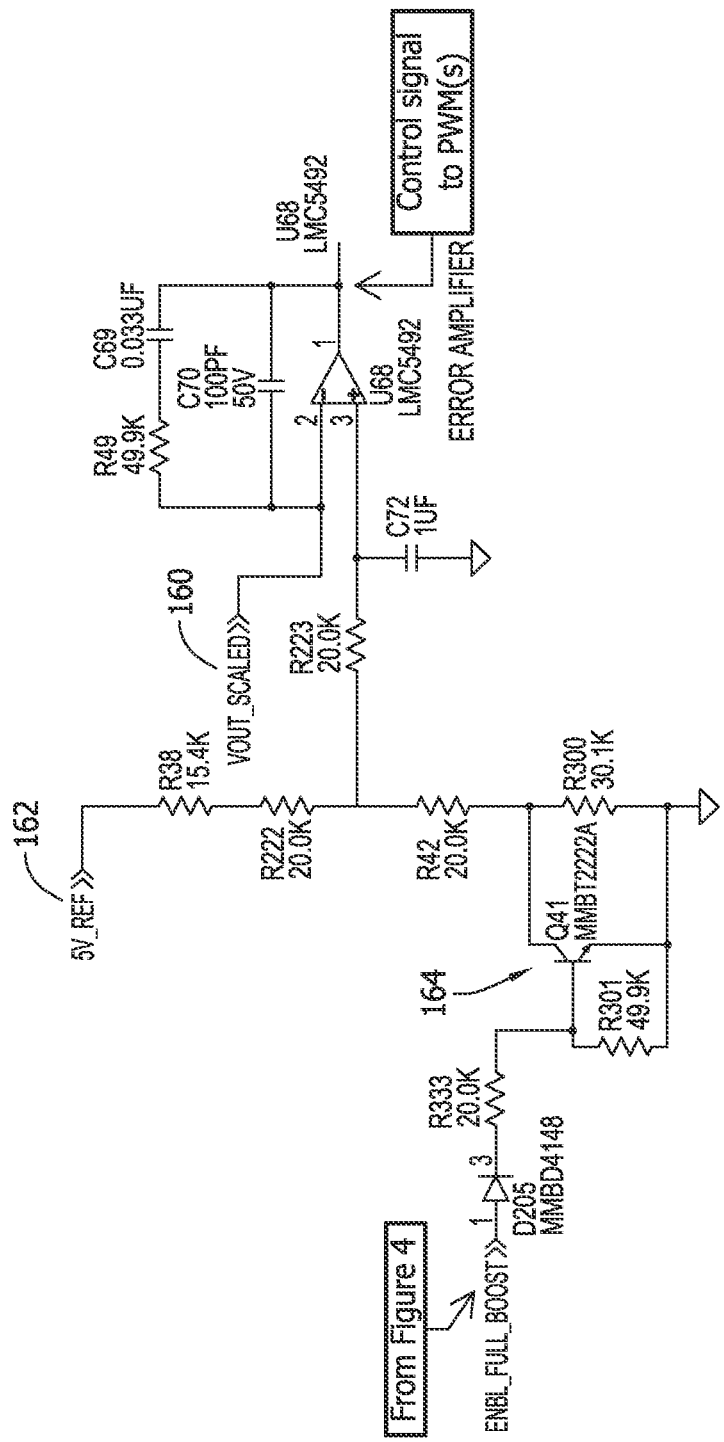
FIG. 3 shows an exemplary circuit schematic of a reference switching circuit for the error amp section of the exemplary boost converter shown in FIG. 1.
Figure 4:
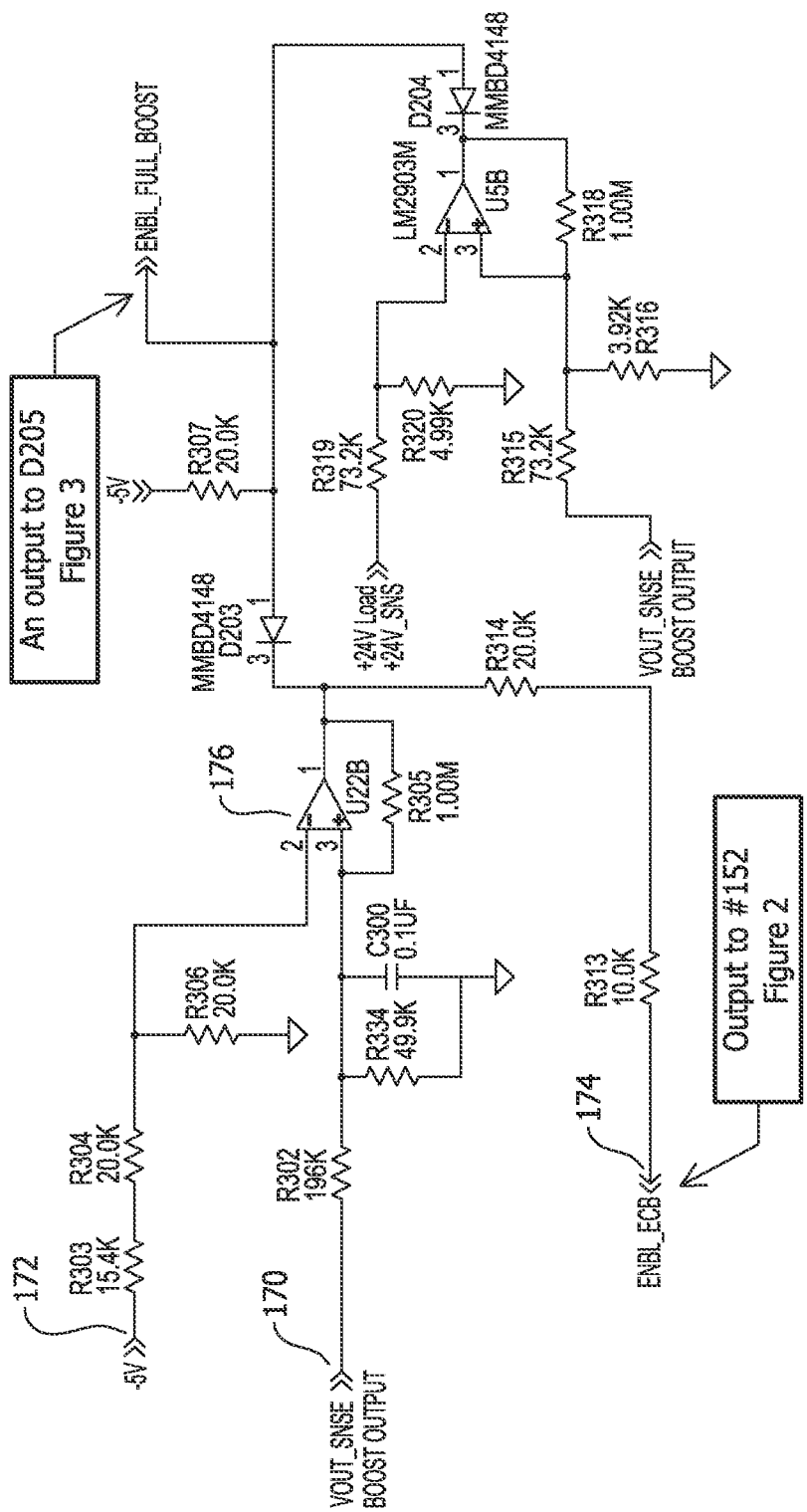
FIG. 4 illustrates an exemplary schematic of an output voltage detection circuit for the control circuitry shown in FIG. 2 and the reference switching scheme of FIG. 3.

FIGS. 2-4 illustrate exemplary schematics of control circuitry to accomplish more effective power delivery to the load 108 while managing the MOSFETs in the controlled impedance switch utilized in the ECB 106 to ensure reliable operation thereof within the parameters of their respective SOAs.

FIG. 2 shows an exemplary schematic of control circuitry to maintain MOSFETs within their SOA while implementing the functions of an ECB/Load Switch/Load Inrush Controller in a boost converter system such as the system 100 shown in FIG. 1. The circuitry generally includes, as shown in FIG. 2, an input terminal 122 that receives the output of the boost converter 104 (designated as Boost Vout in FIG. 2), an output current sensing circuit 124 connected to the input terminal 122 that provides a control output on terminal 122 called Sens, a controlled impedance switch 126 connected to the current sensing circuit 124 and providing selective connection to the load 108 via an output terminal 128 at a voltage Vout Load, and a controller 130 having a number of connection pins 1-10 in the illustrated example and configured to operate the controlled impedance switch 126 as described below. The controller 130 is configured to sense the voltage across the controlled impedance switch 126 (i.e., $\Delta V$ between Vout Load input to the controller 130 at pin #7 and Sense input to the controller 130 at pin #9), and knows the current through controlled impedance switch 126 from $\Delta V$ between Sense on terminal 125 (pin #9 of 130) and Boost Vout on terminal 122 (pin #10 of 130).

In an exemplary embodiment, the controller 130 may be a positive high-voltage power-limiting hotswap analog controller model number TPS2490 that is commercially available from Texas Instruments (www.ti.com). In other embodiments, other controllers are of course possible, and may generally include either analog or programmable processor-based devices having a processor and a memory storage wherein executable instructions, commands, and control algorithms, as well as other data and information such as communication network and protocol parameters required to satisfactorily operate the controlled impedance switch 126 are stored. The memory of the processor-based device may be, for example, a random access memory (RAM), and other forms of memory used in conjunction with RAM memory, including but not limited to flash memory (FLASH), programmable read only memory (PROM), and electronically erasable programmable read only memory (EEPROM). Still other controller devices including a processor or microprocessor may implement the control functionality described below, as well as other equivalent control elements such as, microcontrollers, microcomputers, programmable logic controllers, reduced instruction set (RISC) circuits, application specific integrated circuits and other programmable circuits, logic circuits, equivalents thereof, and any other circuit or processor capable of executing the functions described below.

The output of boost converter 104 (FIG. 1) is supplied the terminal 122 and to the controller 130 at its input VCC port (designated as pin #10 in FIG. 2). The controller 130 senses current flow through the controlled impedance switch 126 by monitoring the voltage difference between Sense at terminal 125 (input to the controller 130 via pin #9) and Boost Vout (input to the controller via pin #10). The controller 130 also senses the voltage across the switch 126 by monitoring the voltage difference between Sense (pin #9) and Vout Load (input to the controller 130 via the pin #7). Controller 130, having knowledge of nearly instantaneous voltage across and current through controlled impedance switch 126, and given in this case using a TPS2490 with its hardware programmed limits as to allowed max current and power and time in fault (with a different controller these limits may be set in software), controls the conduction of switch 126 so as to keep it within its specified SOA.

As shown in FIG. 2, in one embodiment the MOSFET controlled impedance switch 126 includes three MOSFETS 132, 134, 136 connected in parallel. Specifically the MOSFETs 132, 134 and 136 are n type or n-channel MOSFET elements each having a source, a drain, and a gate. In a particular embodiment, the MOSFET elements 132, 134, 136 may be model number IRF1405S N-Channel MOSFET elements that are commercially available from International Rectifier (www.irf.com). In alternative embodiments, other MOSFETS, other types of MOSFETs, and other equivalent impedance elements may be utilized in lieu of the MOSFETs 132, 134, 136. Further, while three MOSFETs 132, 134, 136 are shown to accommodate certain types of loads, other arrangements are possible having different numbers of MOSFETs, including a single MOSFET element, depending on the application.

The gate of each MOSFET 132, 134 and 136 is connected to a GATE output (designated as pin 8 in FIG. 2) of the controller 130 as shown at terminals 138, 140, 142. The source of each MOSFET 132, 124 and 136 is connected to the switch output terminal 128, and from there to the load 108. The drain of each MOSFET 132, 134 and 136 (referenced as 146, 148, 150) is connected to the current sensing circuit 124 and then to the power input terminal 122 receiving the output of Boost Vout of the boost converter 104. The flow of current between the source and the drain in each MOSFET 132, 134 and 136 (and hence between the input terminal 122 and the output terminal 128) is controlled by the voltage applied to the gates at terminals 138, 140, 142 as determined by the controller 130.

In an illustrative embodiment, the MOSFET elements 132, 134, 136 are each an Enhancement mode MOSFET and possess a positive gate-to-source threshold value, $V_{gs\ (threshold)}$. When a positive value of gate-to-source voltage ($V_{gs}$) rises to and exceeds this value, the drain-to-source current rises rapidly if a positive value of drain-to-source voltage is simultaneously present. The rate of current rise per unit change in gate voltage is called the forward transconductance of the MOSFET device, gfs. As those in the art will appreciate, the forward transconductance value may range from small values (about 0.1 for example) to large values (about 100 for example), depending upon the construction of the MOSFET element. Therefore, for small changes in gate voltage, large changes in drain-source current are possible.

In an OFF state, each MOSFET element 132, 134, 136 resistively prevents or precludes current from flowing through the switch 126. Assuming a connected load 108, as long as the gate-to-source voltage $V_{gs}$ at terminals 138, 140, 142 is higher than the threshold value $V_{gs(threshold)}$ for the respective MOSFET elements 132, 134, 136, which defines a turn ON voltage for the respective MOSFET, drain to source current will flow from each MOSFET drain terminal 146, 148, 150 to source terminal 128. Accordingly, when the MOSFETs are turned ON, current will flow from the boost converter output via the input terminal 122 through the current sense element 124 and the controlled impedance switch 126 and to the load 108 via the output terminal 128.

On the other hand, if $V_{gs}$ is at a value below the threshold value $V_{gs(threshold)}$ for the respective MOSFETs 132, 134, 136 the MOSFETS are essentially "OFF" with a drain current that is typically a fraction of a milliampere. Thus, in the "OFF" state, effectively no current flows through the switch 126, and accordingly, essentially no current flows to the load 108 via the output terminal 128. Because the controller 130 determines $V_{gs}$ at the gate terminals 138, 140, 142 the controller can effectively operate the MOSFETs 132, 134, 136 to either allow or impede current flow to the load 108 via the controlled impedance switch 126 and the output terminal 128.

As will be further explained below, when the voltage output Boost Vout of the boost converter 104, which in the example of FIG. 2 is supplied to the controller 130 pin #10, is below a predetermined threshold, controller 130 will be inactive and not generate gate drive voltage at 138, 140, 142 for switch 126, thus providing no voltage or current for load 108 at the power output terminal 128. When the controller input voltage at pin #10 (corresponding to Boost Vout of the boost converter 104) rises above the predetermined threshold, the controller 130 is enabled via an input 152 (pin #1 in FIG. 2) and the controller 130 thereafter actively controls the gate voltage output (pin #8 in FIG. 2) to the gate terminals 138, 140, 142 of the impedance switch 126. At this point, the controller 130 actively manages current flow through the MOSFETs 132, 134 and 136 via controlling the output gate voltage at pin #8, which in turn determines whether the MOSFETs 132, 134, 136 in the switch 126 are ON (saturated/low impedance), ON but in linear mode (higher variable impedance), or OFF.

A control feedback signal Sense is input to the controller 130 via terminal 125 (input to the controller 130 at pin #9 in FIG. 2) via the output current sensing circuit 124. As shown in FIG. 2, a resistor network is provided and voltage proportional to current through the resistor network is input to the controller 130 between pins #9 and #10. Alternatively, current may be sensed and a signal fed back to the controller 130 in a similar manner so that the controller 130 can regulate the gate voltage for the impedance switch 126 to ensure that the MOSFETs operate within their respective SOAs (i.e., that the MOSFET drain currents and resulting instantaneous power are operating at or below their maximum safe values as determined from manufacturer provided SOA curves). A variety of different voltage and current sensing techniques are known and may be utilized as desired for feedback purposes.

In an initial state, when the power source/supply 102 is first connected to the boost converter 104, the controller 130 is not enabled, the MOSFETs 132, 134 and 136 are OFF and current flow though the switch 126 to the load 108 is precluded. In this state Boost Vout at terminal 122 will rise from zero and very quickly reach a steady state value equal to the voltage $V_{in}$ of the power supply 102 (e.g., 12V) minus a diode voltage drop $V_f$. Should the controlled impedance switch 126 be activated, the voltage ramp-up for the switch 126 (and also the load 108) from zero to 12V in this example generally presents far less issue with the SOAs of the MOSFETs 132, 134, 136 utilized in the switch 126 than if enabled when at a far higher input voltage.

FIG. 3 shows an exemplary schematic of a reference switching circuit for the boost converter control circuitry shown in FIG. 2. As shown in FIG. 3, a reference of about 5V is input at terminal 162, and a General Purpose NPN Transistor 164 (also shown as Q41 in FIG. 3), such as model number MMBT2222A available from, for example, Fairchild Semiconductor (www.fairchildsemi.com) is turned ON and produces a voltage reference for the error amplifier (pin #3) of, in this example, about 1.8V that is compared to a scaled value of the output voltage of the boost converter that is input at 160. In this state, the boost converter voltage output Boost Vout will rise to about 16V at the switch input terminal 122 (FIG. 2). The 16V figure is pertinent to this example because it is the nominal maximum input voltage to boost converter 104 (and thus which will be passed directly through to switch 126 via input 122) that can be expected in a 12V system.

FIG. 4 illustrates an exemplary schematic of an output voltage detection circuit for the control circuitry shown in FIGS. 2 and 3. As shown in FIG. 4, the output voltage (Boost Vout) of the switch at terminal 122 (FIG. 2) is sensed and input to the circuit at terminal 170. The scaled boost output voltage that is an input at terminal 170 is compared by an amplifier 176 (also shown as U22B in FIG. 4) to about a 1.8V reference voltage derived from the 5V that is input at terminal 172. When the input voltage at 170 reaches a threshold of about 9V, a signal is output by the amplifier 176 at terminal 174 to enable the switch 126 (FIG. 2) by providing the signal at the terminal 152 as a controller input EN (Pin 1 in FIG. 2). When the EN signal is provided to the controller 130, it begins enhancing switch 126 (MOSFETs 132, 134, 136) by actively managing the gate voltage at terminals 138, 140, 142. With the controller 130 now active or enabled, the switch 126 is ON and active, and the boost converter 104 will start driving the load 108 through the switch MOSFETs 132, 134, 136 in switch 122 working in linear mode, but with control of $V_{ds}$ and thus switch 126 current to safely keep those devices within their SOAs.

Continuing with this example, once the sensed load voltage at input 170 increases within about 2V (FIG. 4, U5B pin 2 and 3) of the boost converter output $V_{out}$, FIG. 4 U5B pin 1 will change to a low state and the amplifier Q41 (FIG. 3) will turn OFF. This transition will increase the Error Amplifier's reference in FIG. 3 to a scaled 24V set point. The increase in the Error Amplifier signal is slowed down by an RC circuit including R223 and C72 in FIG. 3. At this point $V_{ds}$ is essentially 0V (the MOSFETs are fully ON/saturated) and output current from the switch 122 is controlled by the pulse width modulation (PWM) of the boost converter control.

Figure 5:
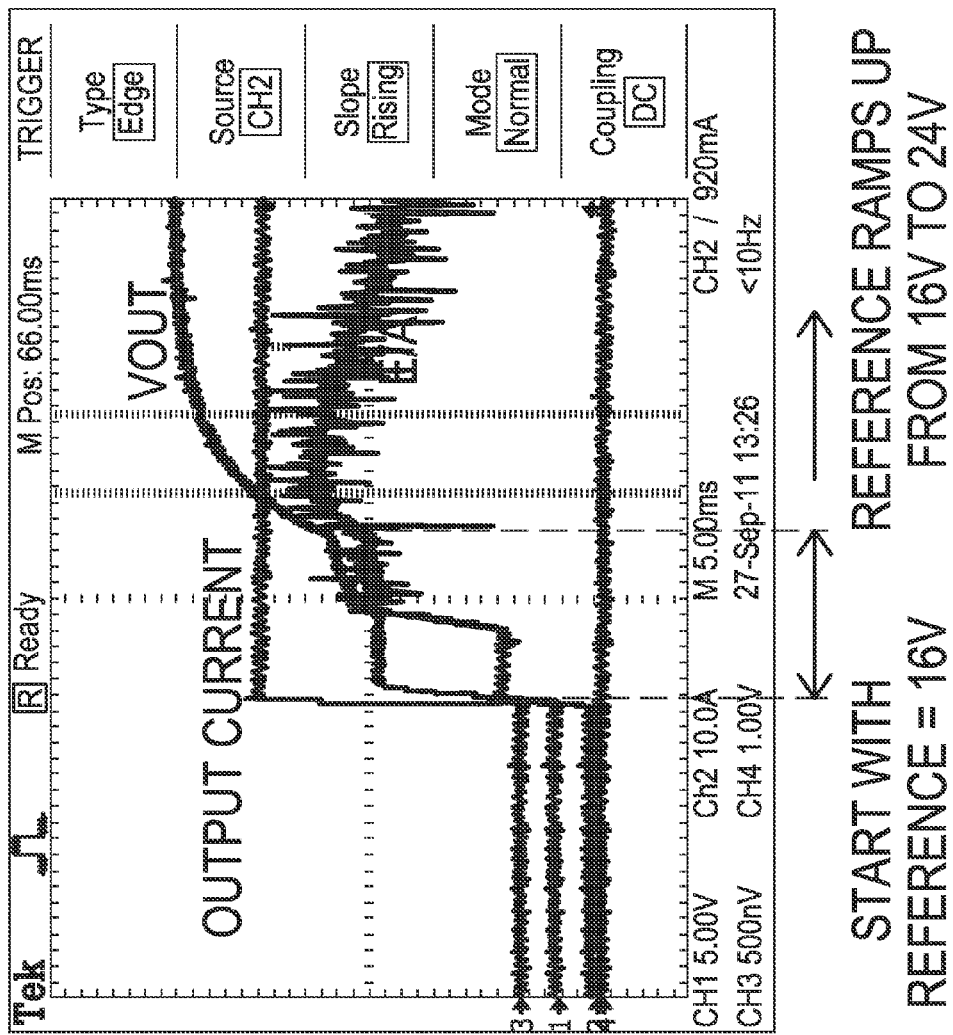
FIG. 5 is a first exemplary waveform plot produced by an exemplary embodiment of the circuitry shown in FIGS. 2-4, wherein the Load is of a Constant Current nature.

FIG. 5 is an exemplary waveform plot produced by an exemplary embodiment of the circuitry shown in FIGS. 2-4. FIG. 5 shows the start-up of a 12 to 24VDC boost converter using the three step sequence described above. When the boost converter 104 is not yet turned ON, its output voltage Boost Vout is already at a diode drop below its Vin (output of Power Supply 102). The switch 126 is then enabled and ramps the output voltage applied to the load 108 from the output of the switch 126 up towards the boost converter output voltage, which in turn begins boosting to 16V. As seen in the waveform of FIG. 5 VOUT rises quickly to about 12VDC, and about 50 msec later the Boost Converter 104 is enabled. The noise spikes evident on the Error Amp (E/A) plot indicate active switching of the boost MOSFETs). Once the boost output voltage and the load voltage are within 2 Volts, the boost reference is reset to demand approximately a 24V output, which as an input to switch 126 is passed to the load 108 at the saturated output terminal 128 of switch 126.

The waveform shown in FIG. 5 occurs when the load current is below the current and power limits set by ECB 106. The circuit may be configured with provisions to reset the ECB 106 and run the start-up process again if there is an overload.

The foregoing example where a nominal 24V heavy load is powered through a 12V-to-24V boost converter from a 12V system battery, is believed to demonstrate that addition of logic/control circuits such as those described above which coordinate actions of the boost converter 104 and an ECB 106 placed between it and the load 108 is effective to solve the problems discussed above. With the approach disclosed above, the ECB load switch MOSFET(s) 132, 134, 136 are ramped linearly from zero to something in the range of about 16V or less prior to allowing the boost converter to boost up to regulated output range of about 24-28V, which puts much less stress on MOSFET(s) 132, 134, 136 than if they ramped the load up directly from zero to the nominal 24-28V required from the boost converter 104 output/ECB 106 input.

It will be appreciated that the same philosophy applies for any similar situation in which the output Boost Vout from converter 104 is much higher than its voltage input. Likewise, while the MOSFET impedance switch as a high-side switch in a positive output path from the boost converter 104 is preferable as described, the teachings herein would also apply equally to a low-side switch, as well as to either positive or negative switched voltages.

In another embodiment, the techniques described above may be applied to a motive system where the load is powered through an ECB directly from a nominal 12V or 24V system battery. That is, considering the block diagram of FIG. 1, the boost converter 104 may be omitted in some embodiments with the battery power supply 102 directly interfacing with the ECB 106. In such an example, the system voltage may from time to time be pulled down several Volts below nominal when a heavy load such as a starter motor is enabled. A similar drop in system voltage may result from operation of a compressor or other heavy load. A version of the control scheme described above employing the ECB 106 may facilitate sensing of the system voltage dip and reduce stress on the Pass MOSFET(s) utilized in the ECB 106 by initiating the controlled impedance turn-ON of the ECB and thus its heavy load during said time of diminished system voltage as the system recovers from the voltage dip. The same philosophy would apply to other, higher voltage motive systems, such as those with nominal 36V, 48V, 60V, 72V, etc. battery power supplies. The ECB concepts described also apply more generally to any lower voltage DC system in which predictable variations, dips, or low frequency ripple may be exploited to bring up a heavy switched load by targeting the onset of ECB linear bring-up of its output to a system voltage minima.

The ECB 106 can be constructed from available components and programmed relatively easily to accomplish the functionality described. Having described the functionality, it is believed that those in the art could implement the control ECB without further explanation.

Figure 6:
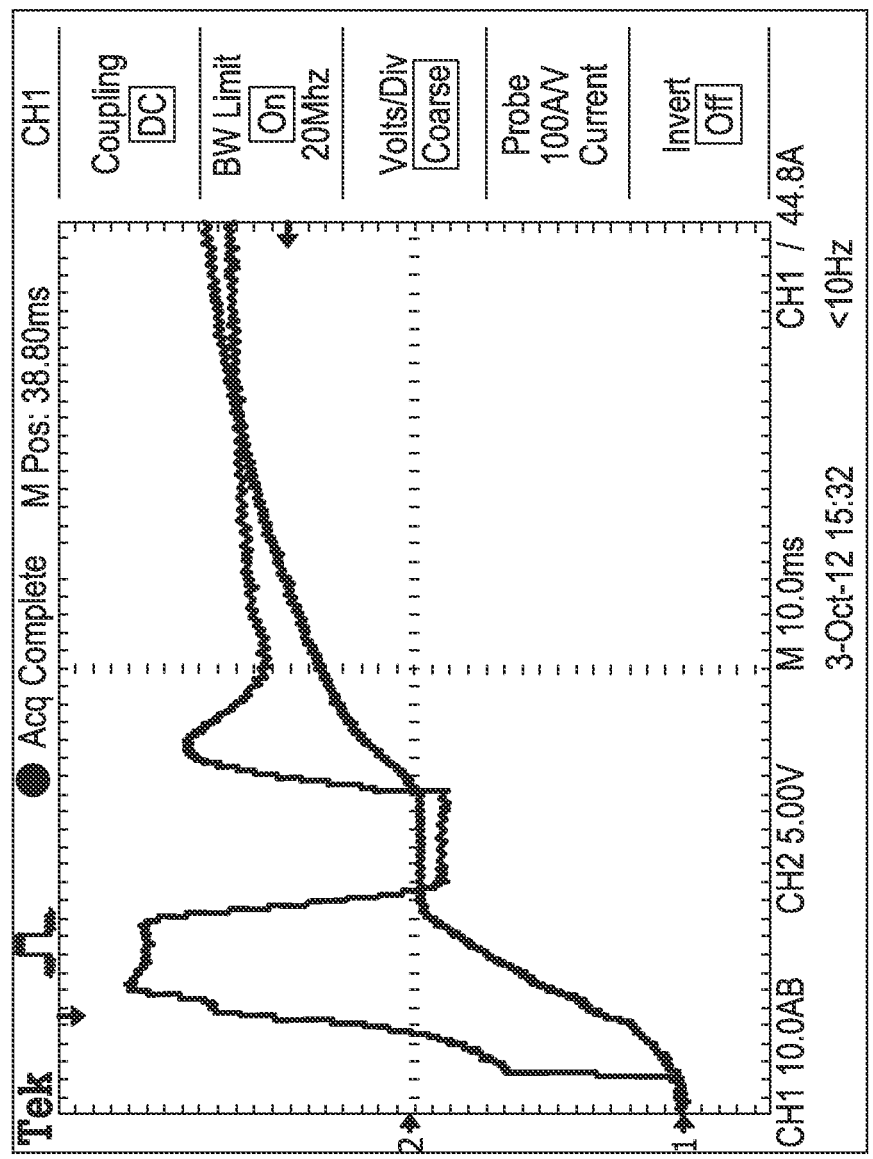
FIG. 6 is a second exemplary waveform plot produced by an exemplary embodiment of a boost converter system according to the present invention, wherein the Load is both low resistance and highly capacitive.

FIG. 6 illustrates another waveform plot generated from a boost converter including an ECB as described above. Specifically, FIG. 6 illustrates a 4-Phase boost converter 104 coordinated in a two stage manner with an ECB 106 as described above. In the example of FIG. 6, a 50 A resistive load in parallel with 56 mF of load capacitance is boosted without overtaxing the SOA of the switch 126. In FIG. 6, channel 1 shows the ECB load current while channel 2 shows the ECB load voltage. Applying Equation (1) above, one notes that the $^{\Delta V}/_{\Delta t}$ of the ECB 106 output will demand dozens of Amps to charge that very large 56 mF of load capacitance, with steep slope changes of the VOUT plot corresponding to big movements in output current.

As demonstrated in FIG. 6, the output voltage of the ECB 106 is ramped up to the lower output voltage setting (about 16V in this example) of the boost converter 104 with the MOSFETs in the ECB 106 in the Linear Mode, and subsequently boosting the output voltage to a full Nominal Output Voltage of about 28V. Since the MOSFETs in the ECB 106 are fully enhanced in the ramp up from 16V to 28V, they are under little stress as the voltage approaches the Nominal Output Voltage. For a given MOSFET SOA capability in the ECB 106, reduction of voltage across the MOSFET(s) while in Linear Mode allows for higher currents without overtaxing the MOSFETS and/or an increased amount of time with the MOSFETS operating in Linear Mode.

The waveforms of FIGS. 5 and 6 are believed to illustrate two fundamental approaches to provide the desired coordination as described above. The three step approach is demonstrated in the waveform of FIG. 5, wherein the ECB is enabled by the coordinating circuit before the boost converter, and thus brings the Load up to a diode drop below the Voltage coming from the Power Supply 102. Next, and as can be seen in FIG. 5, the boost converter is enabled but given a low initial output set-point that may not be very much above that coming from Power Supply 102. In one example the coordination circuit sets this lower regulation point at about 16V, and when the Voltage at the output of ECB 106 connecting to Load 108 gets within about 2V of the output of the Boost Converter 104, the coordination circuit caused the Boost Converter to ramp up towards final regulation at about 24V, and the output of the ECB follows right behind it, and being in almost full saturation, had very little SOA stress during those last two stages. The maximum SOA stress occurs in the first stage while bringing the Load up to a diode drop below Power Supply 102. This example would result in the behavior shown in FIG. 5, in which Load Voltage rises up to a diode drop below Power Supply 102, may stay at that level for a little while, then ramps up towards a new temporary regulation point, and finally ramps up to the desired operational regulation point. There are three distinct portions seen in the plot.

The two step approach is arguably even more effective than the three step approach. At least two main variants of a two step approach are contemplated and are briefly explained below.

The first variant of a two step coordination scheme has the coordination circuitry set the boost converter 104 to a low initial regulation point, such as about 16V in the example of 12V to 24V boost systems. The coordination circuit then enables the boost converter 104 but waits to enable the ECB 106 until after the output of the boost converter 104 has approached that first level. Thereafter, the coordination circuit enables the ECB 106, whose output rises from 0V, and when it gets within say about 2V of that 1st regulation spot, the coordination circuitry causes the boost converter 104 to start ramping up towards the final regulation point, with the ECB 106 following in near saturation and thus low SOA stress. The waveform plot in such an approach would have two distinct portions and would look similar to that seen in FIG. 6.

The second variation of a two step approach is to simply enable the ECB 106 before enabling the boost converter 104, and when the output Voltage of the ECB 106 gets close to the output Voltage of the non-switching boost converter 104 (a diode drop below Power Supply 102), the coordination circuitry then enables the boost converter 104, whose output rises up towards final regulation point with the output of the ECB 106 following right behind it. As the ECB 106 is nearly saturated, it is in low SOA stress for that last half of its journey. The waveform plot of this approach would also resemble the plot shown in FIG. 6, but the plateau Voltage prior to ramping up to final regulation would be different than in the first variation of the two step approach described above.

It is contemplated that similar functionality to the two and three step approaches outlined could easily be accomplished by introducing additional intermediate steps. The introduction of such intermediate steps would render the coordination circuitry somewhat less efficient, but is contemplated in further and/or alternative embodiments of the invention. That is, the invention is not limited to the two and three step approaches. The literal number of steps implemented in the coordination circuitry is not consequential to the result obtained and would achieve at least some of the benefits of the two and three step approaches outlined above and illustrated in the supporting examples.

The benefits and advantages of the invention are now believed to have been amply illustrated in relation to the exemplary embodiments disclosed.

An embodiment of a controlled impedance switch control circuit has been disclosed including: a power input; an electronic impedance switch connected to the power input; an output supplying power to an electrical load; and a controller configured to selectively control the electronic impedance switch to allow or preclude current flow through the electronic impedance switch from the input to the output. The controller is configured to: preclude current flow to the output when the power input rises from zero voltage to a first voltage threshold; and allow regulated current flow to the output when the power input rises above the first voltage threshold.

Optionally, the electronic impedance switch comprises at least one MOSFET element having a safe operating area (SOA), and the controller is configured to regulate current flow to limit operation of the at least one MOSFET element within its SOA. The at least one MOSFET element may include a plurality of MOSFET elements connected in parallel to one another. The at least one MOSFET may include an n type MOSFET element, The power input may receive a power output from a boost converter. The boost converter may be configured to boost a lower supply voltage to about 24-28 VDC. The power input may be connected to a battery power supply. The battery power supply may be a 12V battery. The controller may be a positive high-voltage power-limiting hotswap controller.

The power input may be connected to a direct current (DC to DC) boost converter. The boost converter may be connected to a battery power supply.

An embodiment of a boost converter system has also been disclosed. The boost converter system includes: a power supply; a boost converter receiving an input voltage from the power supply; a controlled impedance switch receiving an output voltage from the boost converter; a load receiving power from an output of the controlled impedance switch; and a controller configured to selectively operate the controlled impedance switch to allow or preclude current flow through the electronic impedance switch to the load. The controller is configured to: preclude current flow to the output when the power input rises from zero voltage to a first voltage threshold; allow a regulated current flow to the output when the power input rises from the first voltage threshold to a second voltage threshold higher than the first threshold, during which time the controlled impedance switch transitions from a potentially high safe operating area (SOA) stress to being nearly saturated and therefore at low SOA stress; and regulate current flow to the output as the power input rises from the second voltage threshold to a third voltage threshold higher than the second voltage threshold, during which time the controlled impedance switch is effectively saturated and thus at low SOA stress.

Optionally, he electronic impedance switch may include at least one MOSFET element, and the controller may be configured to regulate current flow to limit operation of the at least one MOSET element within the SOA. The at least one MOSFET element may include a plurality of MOSFET elements connected in parallel to one another. The at least one MOSFET may be an n type MOSFET element. The system may be configured to boost a power supply voltage to about 24-28 VDC. The power supply may be a battery, and more specifically may be a 12V battery. The controller may be a positive high-voltage power-limiting hotswap controller. The second voltage threshold may be about 16 VDC. The third voltage threshold may be in a range of about 24 VDC to about 28 VDC.

An exemplary method of supplying electrical power to a load in an electrical power system including a power supply, an electronic impedance switch interfacing the power supply with at least one electrical load, and a controller configured to selectively control the electronic impedance switch to allow or preclude current flow through the electronic impedance switch from the power supply to the at least one electrical load, has also been disclosed. The method includes: precluding, with the electronic impedance switch, current flow to the at least one electrical load when the power supply is initially connected to the electronic impedance switch, thereby allowing the voltage at the input of the electronic impedance switch to rise from zero voltage to a first voltage threshold while the current flow to the load is precluded; and causing, with the controller, a regulated current flow to the at least one electrical load when the power input rises from the first voltage threshold to a second voltage threshold higher than the first threshold, during which period the controlled impedance switch will go from a linear mode to saturated with respectively high and low safe operating area (SOA) stress.

Optionally, the electronic impedance switch may include at least one MOSFET element having a SOA, and the method may further include regulating, with the controller, the electronic impedance switch to ramp-up current flow to the at least one electrical load by limiting current flow to maintain operation of the at least one MOSET element within its SOA.

The electronic impedance switch may include a plurality of MOSFET elements connected in parallel to one another, and the method further comprises regulating, with the controller, the electronic impedance switch to ramp-up current flow to the at least one electrical load while maximizing use of MOSFET SOA.

The at least one MOSFET may be a N-type MOSFET element, and the controller may be a power-limiting hotswap controller, with the method further including beginning to enhance the at least one MOSFET only after the first voltage threshold is exceeded.

The electrical power system may also include a boost converter interfacing the power supply and the electronic impedance switch, with the method further including supplying an output voltage from the boost converter to the electronic impedance switch. The boost converter may be operable to receive an input voltage from the power supply and boost the input voltage to an output voltage higher than the input voltage, with the method further including setting the first voltage threshold about equal to the lowest usable input voltage from the power supply, and setting the second voltage threshold about equal to the nominal maximum anticipated input voltage. The method may further include setting a third voltage threshold to the desired boosted output voltage of the boost converter. The method may include selecting the first voltage threshold to be about 9 to about 12VDC, selecting the second voltage threshold to be about 16 VDC, and selecting the third voltage threshold to be in range from about 24 VDC to about 28 VDC.

The electrical power system may be a vehicle power system, wherein the vehicle power system is susceptible to a system voltage drop attributable to one of a starter motor, a compressor or other heavy current drain, and the method including operating the controller to cause the regulated current flow while the vehicle power system is recovering from the system voltage drop. Alternatively, the electrical power system may be non-vehicular but has predictable or periodic significant voltage dips, and the method includes coordinating and enabling, with the electronic impedance switch, an optimal usage of the impedance switch SOA while supplying output power to a heavy connected load.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A controlled impedance switch control circuit comprising:
  a power input;
  an electronic impedance switch connected to the power input;
  an output supplying power to an electrical load; and
  a controller configured to selectively control the electronic impedance switch to allow or preclude current flow through the electronic impedance switch from the power input to the output;
  wherein the controller is configured to:
    preclude current flow to the output when the power input rises from zero voltage to a first voltage threshold; and
    allow regulated current flow to the output when the power input rises above the first voltage threshold.

2. The controlled impedance switch control circuit of claim 1, wherein the electronic impedance switch comprises at least one MOSFET element having a safe operating area (SOA), and the controller is configured to regulate current flow to limit operation of the at least one MOSFET element within its SOA.

3. The controlled impedance switch control circuit of claim 2, wherein the at least one MOSFET element comprises a plurality of MOSFET elements connected in parallel to one another.

4. The controlled impedance switch control circuit of claim 2, wherein the at least one MOSFET element comprises an n type MOSFET element.

5. The controlled impedance switch control circuit of claim 1, wherein the power input receives a power output from a boost converter.

6. The controlled impedance switch control circuit of claim 5, wherein the boost converter is configured to boost a lower supply voltage to about 24-28 VDC.

7. The controlled impedance switch control circuit of claim 1, wherein the power input is connected to a battery power supply.

8. The controlled impedance switch control circuit of claim 7, wherein the battery power supply is a 12V battery.

9. The controlled impedance switch control circuit of claim 1, wherein the controller comprises a positive high-voltage power-limiting hotswap controller.

10. The controlled impedance switch of claim 1, wherein the power input is connected to a direct current (DC to DC) boost converter.

11. The controlled impedance switch of claim 10, wherein the boost converter is connected to a battery power supply.

12. A boost converter system comprising:
a power supply;
a boost converter receiving an input voltage from the power supply;
a controlled impedance switch receiving an output voltage from the boost converter;
a load receiving power from an output of the controlled impedance switch; and
a controller configured to selectively operate the controlled impedance switch to allow or preclude current flow through the controlled impedance switch to the load;
wherein the controller is configured to:
preclude current flow to the output when the input voltage rises from zero voltage to a first voltage threshold;
allow a regulated current flow to the output when the input voltage rises from the first voltage threshold to a second voltage threshold higher than the first threshold, during which time the controlled impedance switch transitions from a potentially high safe operating area (SOA) stress to being nearly saturated and therefore at low SOA stress; and
regulate current flow to the output as the power input rises from the second voltage threshold to a third voltage threshold higher than the second voltage threshold, during which time the controlled impedance switch is effectively saturated and thus at low SOA stress.

13. The boost converter system of claim 12, wherein the controlled impedance switch comprises at least one MOSFET element, and the controller is configured to regulate current flow to limit operation of the at least one MOSET element within the SOA.

14. The boost converter system of claim 13, wherein the at least one MOSFET element comprises a plurality of MOSFET elements connected in parallel to one another.

15. The boost converter system of claim 13, wherein the at least one MOSFET element comprises an n type MOSFET element.

16. The boost converter system of claim 12, wherein the system is configured to boost a power supply voltage to about 24-28 VDC.

17. The boost converter system of claim 12, wherein the power supply comprises a battery.

18. The boost converter system of claim 17, wherein the battery is a 12V battery.

19. The boost converter system of claim 12, wherein the controller comprises a positive high-voltage power-limiting hotswap controller.

20. The boost converter system of claim 12, wherein the second voltage threshold is about 16 VDC.

21. The boost converter system of claim 12, wherein the third voltage threshold is in a range of about 24 VDC to about 28 VDC.

22. A method of supplying electrical power to a load in an electrical power system including a power supply, an electronic impedance switch interfacing the power supply with at least one electrical load, and a controller configured to selectively control the electronic impedance switch to allow or preclude current flow through the electronic impedance switch from the power supply to the at least one electrical load, the method comprising:
precluding, with the electronic impedance switch, current flow to the at least one electrical load when the power supply is initially connected to the electronic impedance switch, thereby allowing the voltage at the input of the electronic impedance switch to rise from zero voltage to a first voltage threshold while the current flow to the load is precluded;
causing, with the controller, a regulated current flow to the at least one electrical load when the voltage at the input of the electronic impedance switch rises from the first voltage threshold to a second voltage threshold higher than the first threshold, during which period the electronic impedance switch will go from a linear mode to saturated with respectively high and low safe operating area (SOA) stress.

23. The method of claim 22, wherein the electronic impedance switch includes at least one MOSFET element having a SOA, and the method further comprises regulating, with the controller, the electronic impedance switch to ramp-up current flow to the at least one electrical load by limiting current flow to maintain operation of the at least one MOSET element within its SOA.

24. The method of claim 23, wherein the electronic impedance switch includes a plurality of MOSFET elements connected in parallel to one another, and the method further comprises regulating, with the controller, the electronic impedance switch to ramp-up current flow to the at least one electrical load while maximizing use of MOSFET SOA.

25. The method of claim 23, wherein the at least one MOSFET is a N-type MOSFET element, and wherein the controller is a power-limiting hotswap controller, the method further comprising beginning to enhance the at least one MOSFET only after the first voltage threshold is exceeded.

26. The method of claim 22, wherein the electrical power system further includes a boost converter interfacing the power supply and the electronic impedance switch, the method further comprising supplying an output voltage from the boost converter to the electronic impedance switch.

27. The method of claim 26, wherein the boost converter is operable to receive an input voltage from the power supply and boost the input voltage to an output voltage higher than the input voltage, the method further comprising setting the first voltage threshold about equal to the lowest usable input voltage from the power supply, and setting the second voltage threshold about equal to the nominal maximum anticipated input voltage.

28. The method of claim 27, further comprising setting a third voltage threshold to the desired boosted output voltage of the boost converter.

29. The method of claim 28, further comprising selecting the first voltage threshold to be about 9 to about 12VDC, selecting the second voltage threshold to be about 16 VDC, and selecting the third voltage threshold to be in range from about 24 VDC to about 28 VDC.

30. The method of claim 22, wherein the electrical power system is a vehicle power system,
wherein the vehicle power system is susceptible to a system voltage drop attributable to one of a starter motor, a compressor or other heavy current drain, and
the method comprising operating the controller to cause the regulated current flow while the vehicle power system is recovering from the system voltage drop.

31. The method of claim 22, wherein the electrical power system is non-vehicular but has predictable or periodic significant voltage dips, and the method comprises coordinating and enabling, with the electronic impedance switch, an optimal usage of the impedance switch SOA while supplying output power to a heavy connected load.

* * * * *